United States Patent
Ching et al.

(10) Patent No.: US 12,057,507 B2
(45) Date of Patent: Aug. 6, 2024

(54) METHOD FOR MANUFACTURING SEMICONDUCTOR DEVICE STRUCTURE

(71) Applicant: TAIWAN SEMICONDUCTOR MANUFACTURING CO., LTD., Hsinchu (TW)

(72) Inventors: Kuo-Cheng Ching, Hsinchu County (TW); Kuan-Ting Pan, Taipei (TW); Kuan-Lun Cheng, Hsinchu (TW); Chih-Hao Wang, Hsinchu County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 0 days.

(21) Appl. No.: 18/316,541

(22) Filed: May 12, 2023

(65) Prior Publication Data
US 2023/0282749 A1    Sep. 7, 2023

Related U.S. Application Data

(63) Continuation of application No. 17/233,451, filed on Apr. 17, 2021, now Pat. No. 11,688,809, which is a continuation of application No. 16/859,779, filed on Apr. 27, 2020, now Pat. No. 10,985,277, which is a continuation of application No. 15/629,885, filed on Jun. 22, 2017, now Pat. No. 10,636,910.

(60) Provisional application No. 62/512,715, filed on May 30, 2017.

(51) Int. Cl.
*H01L 29/78* (2006.01)
*H01L 21/8234* (2006.01)
*H01L 27/088* (2006.01)
*H01L 29/16* (2006.01)
*H01L 29/66* (2006.01)

(52) U.S. Cl.
CPC .... *H01L 29/785* (2013.01); *H01L 21/823431* (2013.01); *H01L 27/0886* (2013.01); *H01L 29/16* (2013.01); *H01L 29/1608* (2013.01); *H01L 29/66545* (2013.01); *H01L 29/66795* (2013.01)

(58) Field of Classification Search
CPC .......... H01L 29/785; H01L 21/823431; H01L 27/0886; H01L 29/16; H01L 29/1608; H01L 29/66545; H01L 29/66795; H01L 21/845; H01L 27/1211; H01L 21/823821
USPC ......................................... 257/288; 438/197
See application file for complete search history.

(56) References Cited

U.S. PATENT DOCUMENTS 6,768,158 B2 * 7/2004 Lee ................... H01L 29/42324
257/317
8,089,117 B2    1/2012 Shimizu
(Continued)

*Primary Examiner* — Jonathan Han
(74) *Attorney, Agent, or Firm* — Maschoff Brennan

(57) ABSTRACT

A method includes forming a SiGe layer over a substrate. A silicon layer is formed over the SiGe layer. The silicon layer and the SiGe layer are patterned to form a fin structure over the substrate. The fin structure includes a remaining portion of the SiGe layer and a remaining portion of the silicon layer over the remaining portion of the SiGe layer. A semiconductive capping layer is formed to cover the fin structure. A top portion of the semiconductive capping layer and the remaining portion of the silicon layer are oxidized to form an oxide layer covering the fin structure.

20 Claims, 8 Drawing Sheets

(56) References Cited

U.S. PATENT DOCUMENTS

| | | |
|---|---|---|
| 8,497,177 B1 * | 7/2013 | Chang ............... H01L 29/66795 |
| | | 438/283 |
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 2005/0093082 A1 | 5/2005 | Son |
| 2010/0019358 A1 | 1/2010 | Cheng |
| 2011/0062518 A1 | 3/2011 | Chan |
| 2015/0102392 A1 * | 4/2015 | Yu ..................... H01L 21/324 |
| | | 257/288 |
| 2015/0123166 A1 | 5/2015 | Jacob |
| 2015/0162438 A1 * | 6/2015 | Chou ................ H01L 21/31055 |
| | | 438/264 |
| 2015/0235905 A1 | 8/2015 | Liaw |

* cited by examiner

METHOD FOR MANUFACTURING SEMICONDUCTOR DEVICE STRUCTURE

RELATED APPLICATIONS

This application is a continuation application of U.S. patent application Ser. No. 17/233,451, filed Apr. 17, 2021, which is a continuation application of U.S. patent application Ser. No. 16/859,779, filed Apr. 27, 2020, now U.S. Pat. No. 10,985,277, issued Apr. 20, 2021, which is a continuation application of U.S. patent application Ser. No. 15/629,885, filed Jun. 22, 2017, now U.S. Pat. No. 10,636,910, issued Apr. 28, 2020, which claims priority to U.S. Provisional Application Ser. No. 62/512,715, filed May 30, 2017, all of which are herein incorporated by reference in their entirety.

BACKGROUND

The electronics industry has experienced an ever increasing demand for smaller and faster electronic devices which are simultaneously able to support a greater number of increasingly complex and sophisticated functions. Accordingly, there is a continuing trend in the semiconductor industry to manufacture low-cost, high-performance, and low power consumption integrated circuits (ICs). These goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in ICs and semiconductor devices calls for similar advances in semiconductor manufacturing processes and technology.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
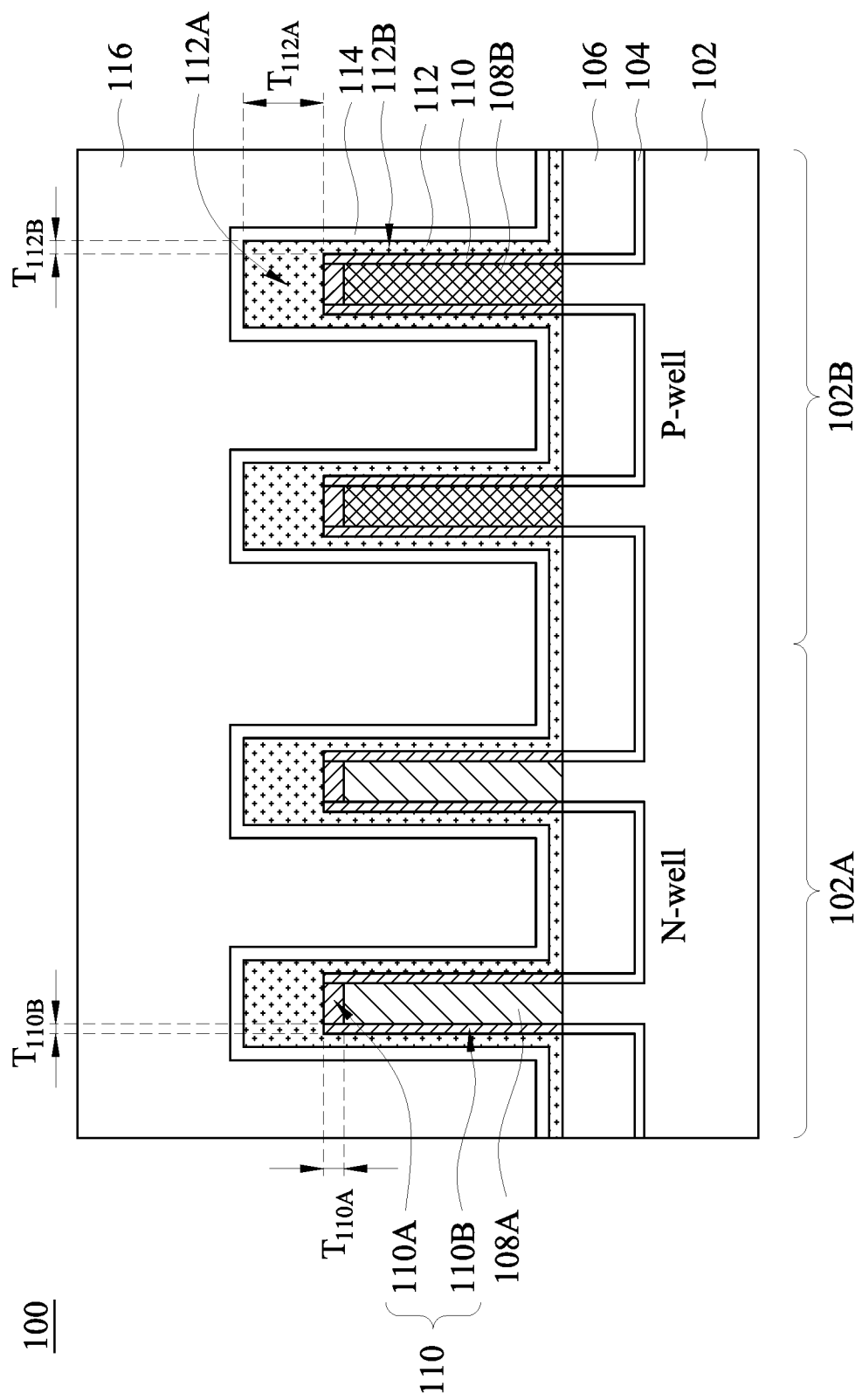
FIG. 1 is a schematic layout diagram of a semiconductor device structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. In addition, the present disclosure may repeat reference numerals and/or letters in the various examples. This repetition is for the purpose of simplicity and clarity and does not in itself dictate a relationship between the various embodiments and/or configurations discussed. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

It will be understood that, although the terms "first," "second," etc., may be used in the claims to describe various elements and/or features, these elements and/or features should not be limited by these terms, and these elements and/or features correspondingly described in the embodiments are presented by different reference numbers. These terms are used to distinguish one element and/or feature from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "upper," "lower," "on," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of the present disclosure are directed to a semiconductor device structure and a method of forming the same. In the semiconductor device structure, a non-uniform thickness oxide layer with a of the oxide layer. Particularly, a portion of the oxide layer above fin structures is formed by oxidating a portion of an underlying capping layer, such that a thickness of the top portion of the oxide layer is increased without producing an overhang structure at the top portion of the oxide layer. In addition, the etching window to a dummy gate structure can be increased, and damages and notching issues of the fin structure can be avoided when performing the etching process with higher power to the dummy gate structure, and thus threshold voltage of the gate structure of the final semiconductor device structure is controlled to a desired value according to a design requirement. Further, the capping layer is formed over the fin structures for providing a protection function for the fin structures and during the subsequent processes (such as forming and removing of a dummy gate structure, forming of a gate structure and a gate dielectric, etc.). A top portion of the capping layer may be at least 3 angstroms, in order to reduce the interface trap density of the oxide layer. Embodiments of the present disclosure provide at least the foregoing advantages for fabricating a semiconductor device, e.g. of 7 nm technology node or beyond.

FIG. 1 is a cross-sectional view of a semiconductor device structure 100 in accordance with some embodiments of the present disclosure. In the semiconductor device structure 100, a substrate 102 is provided, which may be a semiconductor substrate, such as a bulk semiconductor, a silicon-on-insulator (SOI) substrate, or the like. In a case of SOI substrate, a semiconductor material layer is formed on an insulator layer which may be, for example, a buried oxide (BOX) layer, a silicon oxide layer, or the like. The insulator layer is provided on a substrate, typically a silicon substrate or a glass substrate. Another substrate, such as a multi-layered or gradient substrate may also be used. In some embodiments, the semiconductor material layer may be formed from, for example, silicon, germanium, silicon carbide, silicon germanium, gallium arsenide, gallium phosphide, gallium arsenide phosphide, indium arsenide, indium phosphide, indium antimonide, aluminium indium arsenide, aluminium gallium arsenide, gallium indium arsenide, gallium indium phosphide, gallium indium arsenide phosphide, combinations thereof, or another suitable material. In some examples, the substrate 102 includes a silicon germanium layer and a silicon layer lying on the silicon germanium layer.

As shown in FIG. 1, the substrate 102 is separated into two device regions, i.e., a P-type device region 102A and an N-type device region 102B. An N-type well N-well and a P-type well P-well are on the substrate 102 and respectively in the P-type device region 102A and in the N-type device region 102B. The N-type well N-well and the P-type well P-well may have dopants of appropriate types. For example, the N-type well N-well may include N-type dopants, such as phosphorus, antimony, arsenic, and/or the like, and the P-type well P-well may include P-type dopants, such as boron, gallium, indium, and/or the like. Each of the N-type well N-well and the P-type well P-well includes protruded portions, and a liner layer 104 and an isolation feature 106 are between two neighboring protruded portions of the N-type well N-well and/or the P-type well P-well. The liner layer 104 is conformal to side surfaces of the protruded portions of the N-type well N-well and the P-type well P-well. The liner layer 104 may include silicon nitride, silicon carbide, silicon carbon nitride, silicon oxycarbonitride, combinations thereof, or the like. The isolation feature 106 is formed for electrically isolating fin structures 108A in the P-type device region 102A from fin structures 108B in the N-type device region 102B. The isolation feature 106 may include flowable oxide, such as phosphosilicate glass (PSG), borosilicate glass (BSG), boron-doped phosphosilicate glass (BPSG), tetraethyl orthosilicate (TEOS) oxide, titanium nitride, silicon oxycabride (SiOC), or another low-k nonporous dielectric material.

In the P-type device region 102A, the fin structures 108A extend from the N-type well N-well, and in the N-type device region 102B, the fin structures 108B extends from the P-type well P-well. The fin structures 108A are respectively on the protruded portions of the N-type well N-well, and the fin structures 108B are respectively on the protruded portions of the P-type well P-well. The fin structures 108A may include, for example, silicon, germanium, silicon germanium, germanium boron, silicon germanium boron, a III-V material (such as indium antimonide, gallium antimonide, indium gallium antimonide), combinations thereof, or the like. The fin structures 108B may include, for example, silicon, silicon phosphide, silicon carbide, silicon phosphide carbide, germanium, germanium phosphide, a III-V material (such as indium phosphide, aluminium arsenide, gallium arsenide, indium arsenide, gallium indium arsenide and aluminium indium arsenide), combinations thereof, or the like. In addition, the fin structures 108A and 108B are doped with dopants of appropriate types and concentrations. For example, P-type dopants, such as boron, boron fluorine, silicon, germanium, carbon, zinc, cadmium, beryllium, magnesium, indium, combinations thereof, and/or the like, may be implanted into the fin structures 108A with a concentration of about $10^{18}$ atoms/cm$^3$ to about $10^{22}$ atoms/cm$^3$, and N-type dopants, such as phosphorus, arsenic, antimony, silicon, germanium, carbon, oxygen, sulfur, selenium, tellurium, combinations thereof, and/or the like, may be implanted into the fin structures 108B with a concentration of about $10^{18}$ atoms/cm$^3$ to about $10^{22}$ atoms/cm$^3$.

A capping layer 110 is over the fin structures 108A and 108B, and an oxide layer 112 is over the substrate 102 and covers the isolation feature 106 and the capping layer 110. As shown in FIG. 1, the capping layer 110 includes a top portion 110A and a sidewall portion 110B; the top portion 110A surrounds a top surface of each of the fin structures 108A and 108B, while the sidewall portion 110B surrounds side surface of each of the fin structures 108A and 108B. The capping layer 110 may include essential silicon. A thickness $T_{110A}$ of the top portion 110A and a thickness $T_{110B}$ of the sidewall portion 110B of the capping layer 110 may be the same or different. In some embodiments, the thickness $T_{110A}$ of the top portion 110A may be at least 3 angstroms, in order to reduce the interface trap density of the oxide layer 112. Further, the thickness $T_{110B}$ of the sidewall portion 110B may also be at least 3 angstroms.

The oxide layer 112 may include silicon oxide, silicon oxynitride, silicon oxycarbide, combinations thereof, or the like, and may be formed by a deposition process, such as a chemical vapor deposition (CVD) process, a sub-atmospheric CVD (SACVD) process, a physical vapor deposition (PVD) process, an atomic layer deposition (ALD) process, or another suitable process. In some embodiments, a portion of the oxide layer 112 is formed by performing an oxidation process on the capping layer 110.

The oxide layer 112 includes a top portion 112A and a sidewall portion 112B. For example, for the semiconductor device structure 100 of 7 nm technology node, a thickness $T_{112B}$ of the sidewall portion 112B may be about 37 angstroms; for the semiconductor device structure 100 of 5 nm technology node or beyond, the thickness $T_{112B}$ of the sidewall portion 112B may be about 26 angstroms or less. A thickness $T_{112A}$ of the top portion 112A is greater than the thickness $T_{112B}$ of the sidewall portion 112B. In some embodiments, the thickness $T_{112A}$ of the top portion 112A is greater than the thickness $T_{112B}$ of the sidewall portion 112B by about 10 angstroms to about 50 angstroms. For example, the thickness $T_{112A}$ of the top portion 112A may be greater than the thickness $T_{112B}$ of the sidewall portion 112B by about 15 angstroms to about 25 angstroms.

A gate dielectric 114 is over the fin structures 108A and 108B, the capping layer 110 and the oxide layer 112. As shown in FIG. 1, the gate dielectric 114 covers the top portion 112A and the sidewall portion 112B of the oxide layer 112. The gate dielectric 114 may include a material such as, but not limited to, silicon oxide, hafnium oxide, titanium oxide, aluminum oxide, tin oxide, zinc oxide, high-k dielectrics, combinations thereof, and/or the like. In some embodiments, the gate dielectric 114 includes multi-layer structure of, for example, silicon oxide or silicon oxynitride with a high-k dielectric. In alternative embodiments, an interfacial layer (not shown) may also be formed between the oxide layer 112 and gate dielectric 114.

A gate structure 116 is over the fin structures 108A and 108B, the capping layer 110, the oxide layer 112 and the gate dielectric 114. The gate structure 116 may include a metallic material (such as titanium, tantalum, tungsten, aluminum, molybdenum, platinum and hafnium), a metal silicide material (such as titanium silicide, tantalum silicide, tungsten silicate, molybdenum silicate, nickel silicide and cobalt silicide), a metal nitride material (such as titanium nitride, tantalum nitride, tungsten nitride, molybdenum silicate, nickel nitride and cobalt nitride), silicided metal nitride (such as titanium silicon nitride, tantalum silicon nitride and tungsten silicon nitride), polysilicon, amorphous silicon, combinations thereof, and/or another suitable material.

Figure 2A:
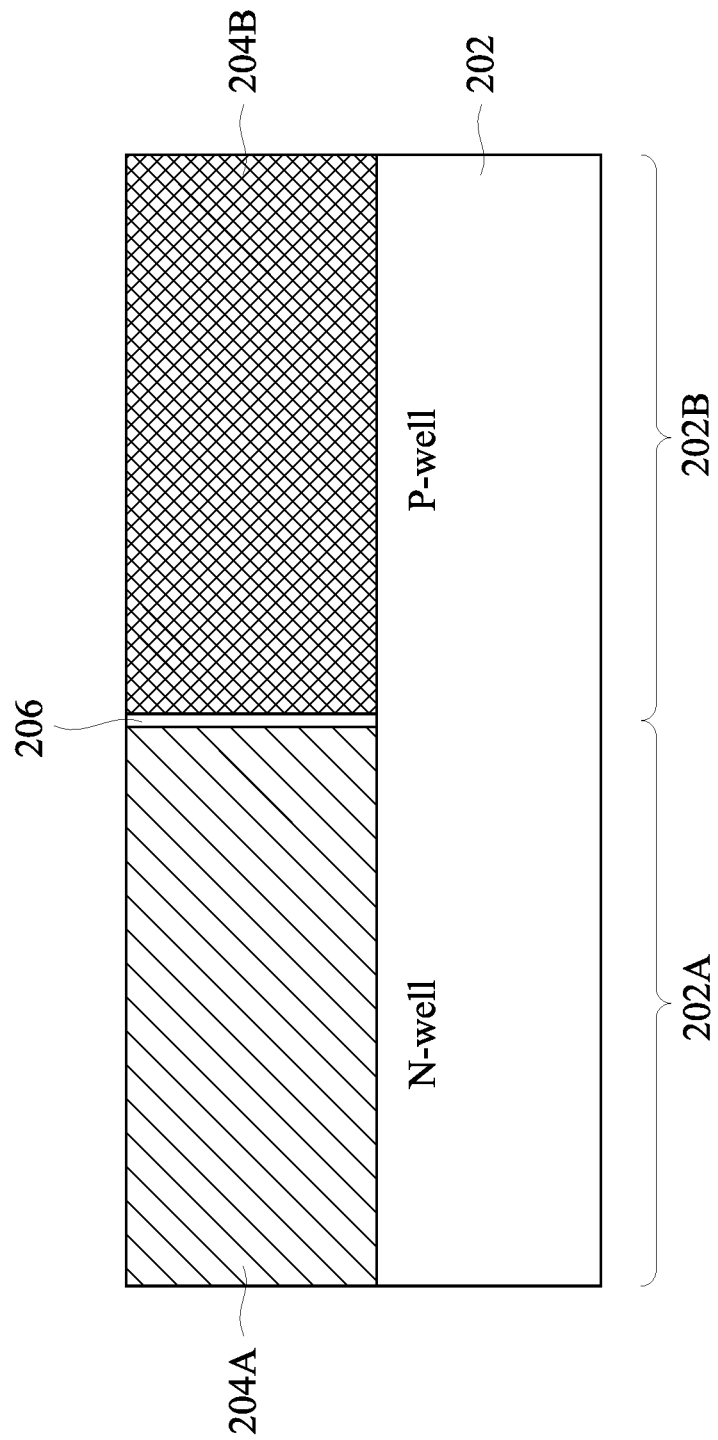
FIG. 2A to FIG. 2G are schematic cross-sectional views of intermediate stages in the formation of a semiconductor device structure in accordance with some embodiments of the present disclosure.

FIG. 2A to FIG. 2G illustrate cross-sectional views of various intermediary steps of forming a semiconductor device structure in accordance with various embodiments. In FIG. 2A, a substrate 202 is illustrated. The substrate 202 may be a semiconductor substrate, such as a bulk semiconductor, an SOI substrate, or the like. In a case of SOI substrate, a semiconductor material layer is formed on an insulator layer which may be, for example, a BOX layer, a silicon oxide layer, or the like. The insulator layer is provided on a substrate, typically a silicon substrate or a glass substrate. Another substrate, such as a multi-layered or gradient substrate may also be used. In some embodiments, the semiconductor material layer may be formed from, for example, silicon, germanium, silicon carbide, silicon germanium, gallium arsenide, gallium phosphide, gallium arsenide phosphide, indium arsenide, indium phosphide, indium antimonide, aluminium indium arsenide, aluminium gallium arsenide, gallium indium arsenide, gallium indium phosphide, gallium indium arsenide phosphide, combinations thereof, or another suitable material.

The substrate 202 includes a P-type device region 202A and an N-type device region 202B, and an N-type well N-well and a P-type well P-well on the substrate 202 are respectively in the P-type device region 202A and the N-type device region 202B. The N-type well N-well and the P-type well P-well may be formed by implanting dopants of appropriate types into the substrate 202. For example, the N-type well N-well may be formed by implanting N-type dopants, such as phosphorus, antimony, arsenic, and/or the like, and the P-type well P-well may be formed by implanting P-type dopants, such as boron, gallium, indium, and/or the like.

Semiconductor layers 204A and 204B are formed over the substrate 202. As shown in FIG. 2A, the semiconductor layer 204A is formed on the N-type well N-well and in the P-type device region 202A, and the semiconductor layer 204B is formed on the P-type well P-well and in the N-type device region 202B. The semiconductor layer 204A may be formed from, for example, silicon, germanium, silicon germanium, germanium boron, silicon germanium boron, a III-V material (such as indium antimonide, gallium antimonide, indium gallium antimonide), combinations thereof, or the like. The semiconductor layer 204B may be formed from, for example, silicon, silicon phosphide, silicon carbide, silicon phosphide carbide, germanium, germanium phosphide, a III-V material (such as indium phosphide, aluminium arsenide, gallium arsenide, indium arsenide, gallium indium arsenide and aluminium indium arsenide), combinations thereof, or the like. Each of the semiconductor layers 204A and 204B may be formed by using an epitaxy process, such as a metal-organic (MO) CVD process, a liquid phase epitaxy (LPE) process, a vapor phase epitaxy (VPE) process, a molecular beam epitaxy (MBE) process, a selective epitaxial growth (SEG) process, combinations thereof, and/or another suitable process. Then, the semiconductor layers 204A and 204B are doped with dopants of appropriate types and concentrations. For example, P-type dopants, such as boron, boron fluorine, silicon, germanium, carbon, zinc, cadmium, beryllium, magnesium, indium, combinations thereof, and/or the like, may be implanted into the semiconductor layer 204A with a concentration of about $10^{18}$ atoms/cm$^3$ to about $10^{22}$ atoms/cm$^3$, and N-type dopants, such as phosphorus, arsenic, antimony, silicon, germanium, carbon, oxygen, sulfur, selenium, tellurium, combinations thereof, and/or the like, may be implanted into the semiconductor layer 204B with a concentration of about $10^{18}$ atoms/cm$^3$ to about $10^{22}$ atoms/cm$^3$.

In some embodiments, as shown in FIG. 2A, a spacer 206 is formed between the semiconductor layers 204A and 204B, in order to separate the semiconductor layers 204A and 204B from each other. The spacer 206 may be formed including a material such as silicon nitride, silicon oxynitride, silicon carbide, and/or the like. Further, a planarization process, such as a chemical mechanical polishing (CMP) process, is performed to planarize the semiconductor layers 204A and 204B and the spacer 206.

Figure 2B:
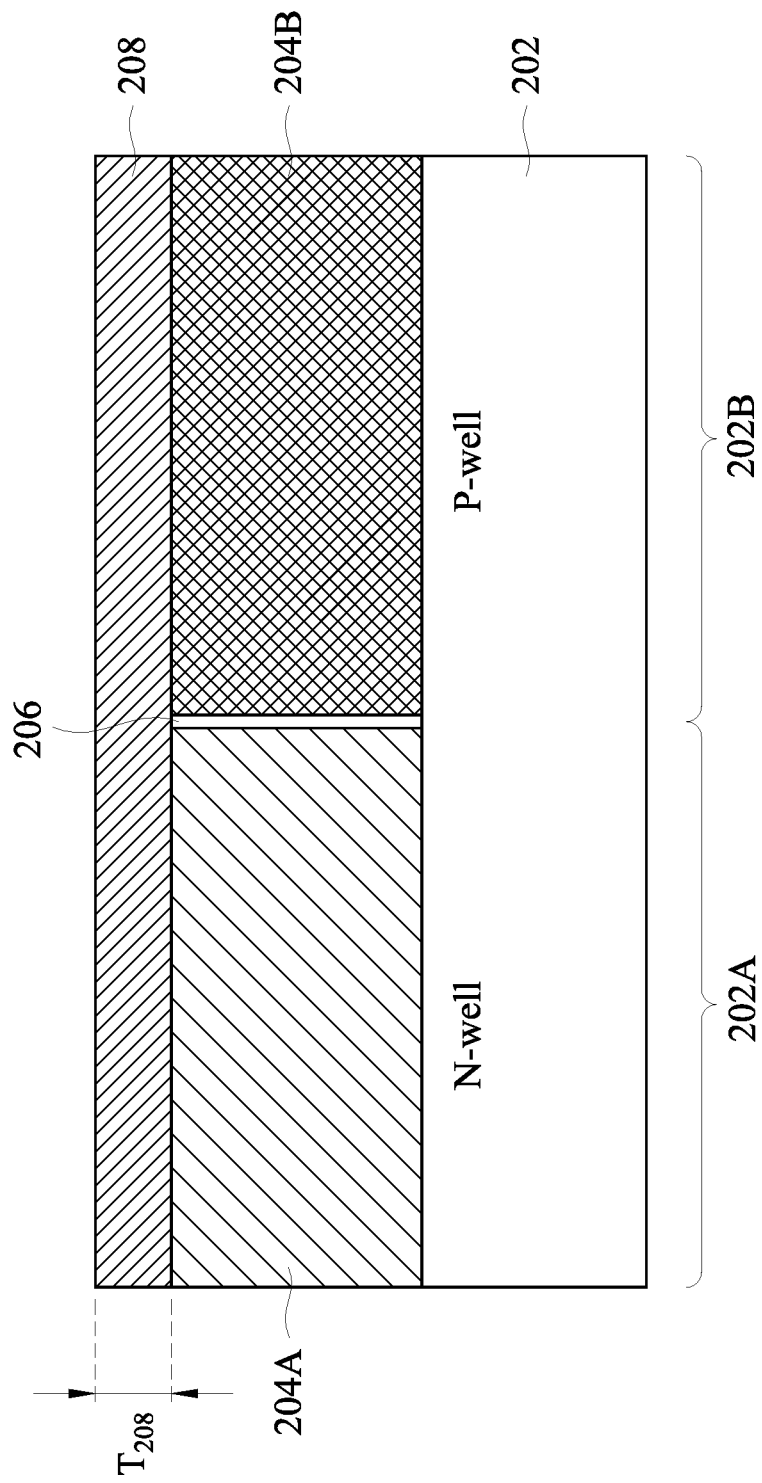

In FIG. 2B, an epitaxial layer 208 is formed over the substrate 202, the semiconductor layers 204A and 204B and the spacer 206. The epitaxial layer 208 may be formed from essential silicon, and may be formed by an epitaxial growth process, a CVD process, a PVD process, and/or another suitable deposition process. In some embodiments, the epitaxial layer 208 is formed with a thickness of about 40 angstroms.

Figure 2C:
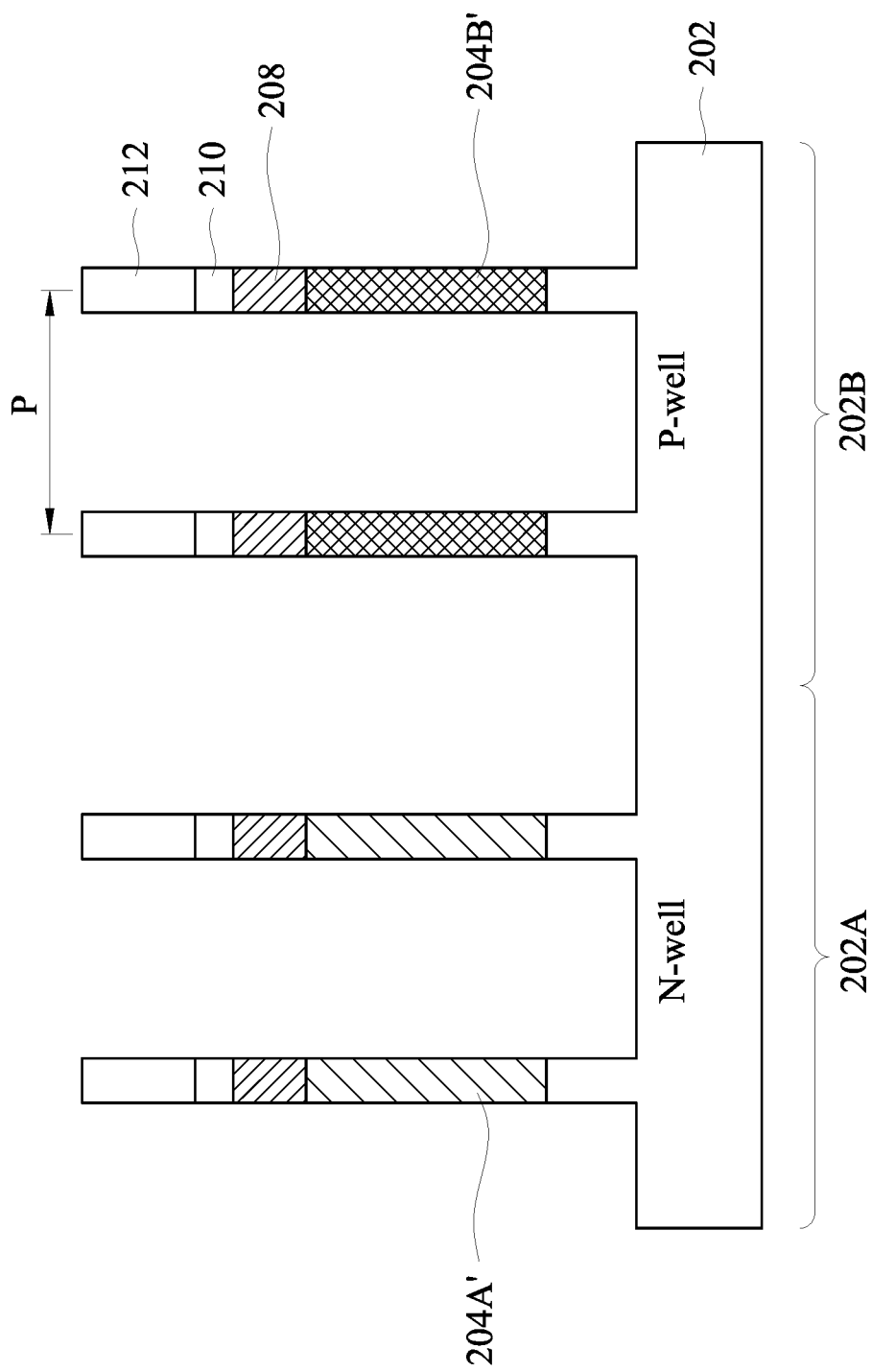

In FIG. 2C, a dielectric layer 210 and a hard mask layer 212 are sequentially formed over the epitaxial layer 208. The dielectric layer 210 may be used as an adhesive layer between the epitaxial layer 208 and the hard mask layer 212, and may be used as a etch stop layer for etching the hard mask layer 212. The dielectric layer 210 may be formed from an oxide material, such as silicon oxide, hafnium oxide, combinations thereof, and/or the like, and may be formed by using a thermal oxidation process or another suitable process. The hard mask layer 212 may be formed from a nitride material, such as silicon nitride, silicon carbon nitride, titanium nitride, combinations thereof, and/or the like, and may be formed by using a deposition process, such as a CVD process, a low pressure CVD (LPCVD) process, a plasma enhanced CVD (PECVD) process, a PVD process, an ALD process, combinations thereof, and/or another suitable process. Then, a patterned photoresist layer (not shown) is formed over the hard mask layer 212, and an etching process, such as a dry etching process, is performed to remove the spacer 206 and portions of the substrate 202, the semiconductor layers 204A and 204B, the epitaxial layer 208, the dielectric layer 210 and the hard mask layer 212, so as to form fin structures 204A' from the semiconductor layer 204A and fin structures 204B' from the semiconductor layer 204B. In some other embodiments, each of the fin structures 204A' and 204B' has a width that gradually increases from the top portion to the lower portion. A pitch between two adjacent fin structures 204A' or 204B' (e.g. the pitch P between the fin structures 204B') may be about 26 angstrom or less. After forming the fin structures 204A' and 204B', the dielectric layer 210 and the hard mask layer 212 are removed by one or more etching processes and/or another suitable removing process.

Figure 2D:
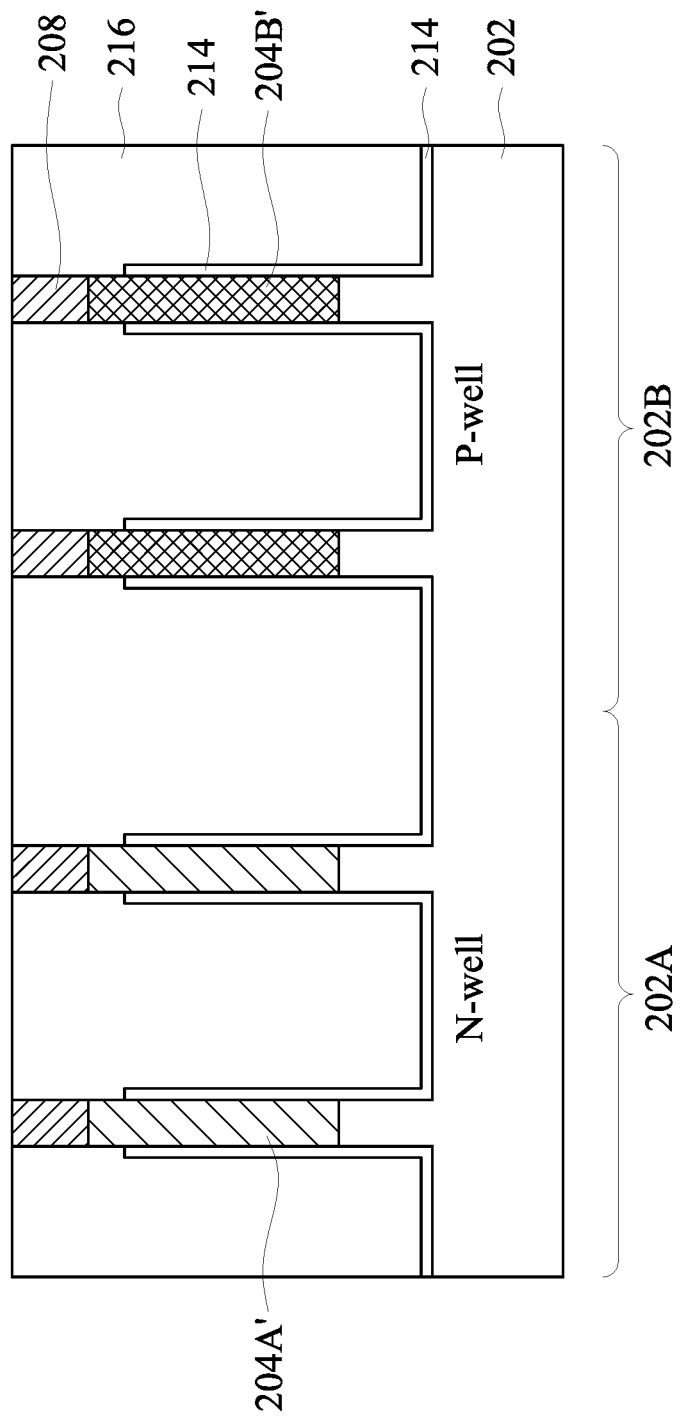

In FIG. 2D, a liner layer 214 is formed surrounding a lower portion of the side surfaces of each of the fin structures 204A' and 204B', and an isolation feature 216 is formed over the substrate 202, the fin structures 204A' and 204B' and the liner layer 214. The liner layer 214 may be formed from, for example, silicon nitride, silicon carbide, silicon carbon nitride, silicon oxycarbonitride, combinations thereof, or the like, and may be formed by a deposition process (such as a CVD process, a PVD process and an ALD process) and a thermal oxidation process. The isolation feature 216 is formed for electrically isolating the fin structures 204A' in the P-type device region 202A from the fin structures 204B' in the N-type device region 202B. The isolation feature 216 may be formed including flowable oxide, such as PSG, BSG, BPSG, TEOS oxide, titanium nitride, silicon oxycabride, and/or another low-k nonporous dielectric material. The isolation feature 216 may be formed from a flowable oxide by using a flowable CVD process or another suitable process.

Figure 2E:
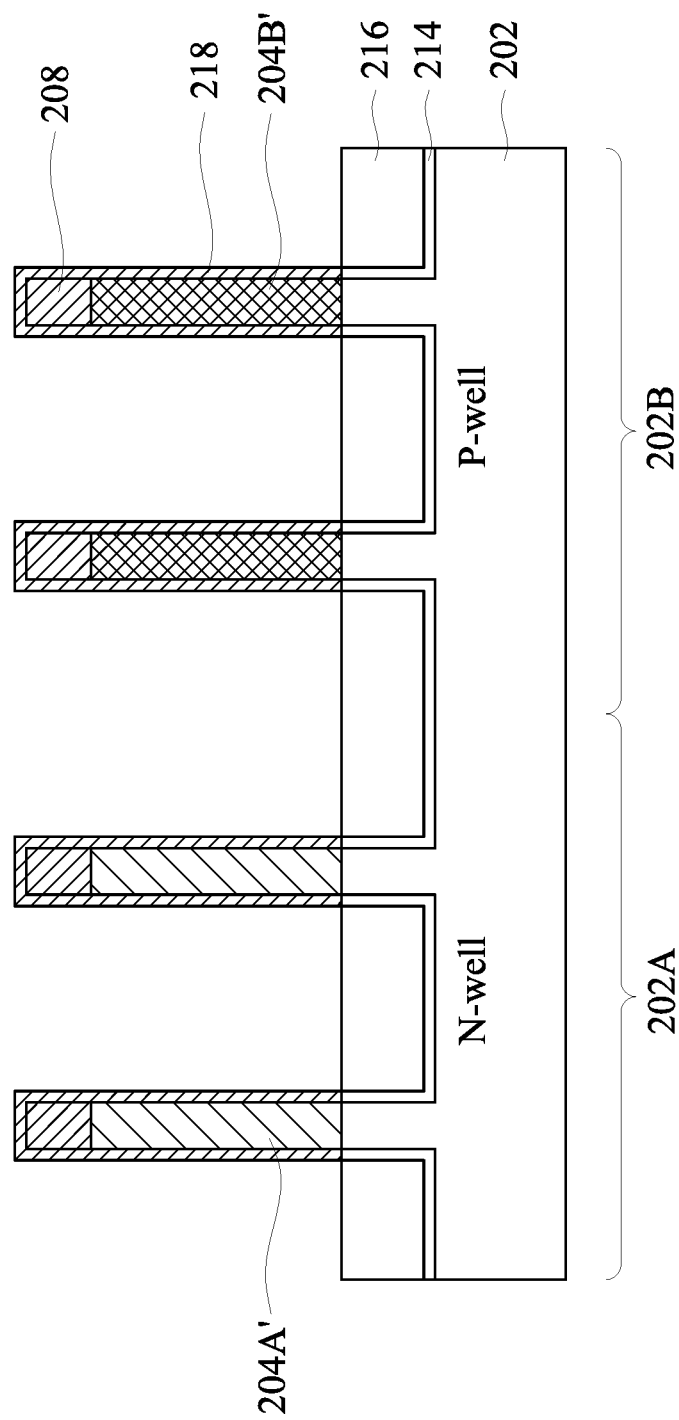

In FIG. 2E, portions of the liner layer 214 and the isolation feature 216 above the substrate 202 are removed are removed by using one or more processes, such as a CMP process, an etching back process, combinations thereof, and/or the like. Next, a capping layer 218 is formed surrounding side surfaces of the fin structures and on the epitaxial layer 208. The capping layer 218 and the epitaxial layer 208 provide a protection function for the fin structures 204A' and 204B' during the subsequent processes. The capping layer 218 may be formed from essential silicon by using an ALD process, a plasma enhanced ALD (PEALD) process, or another suitable process.

Figure 2F:
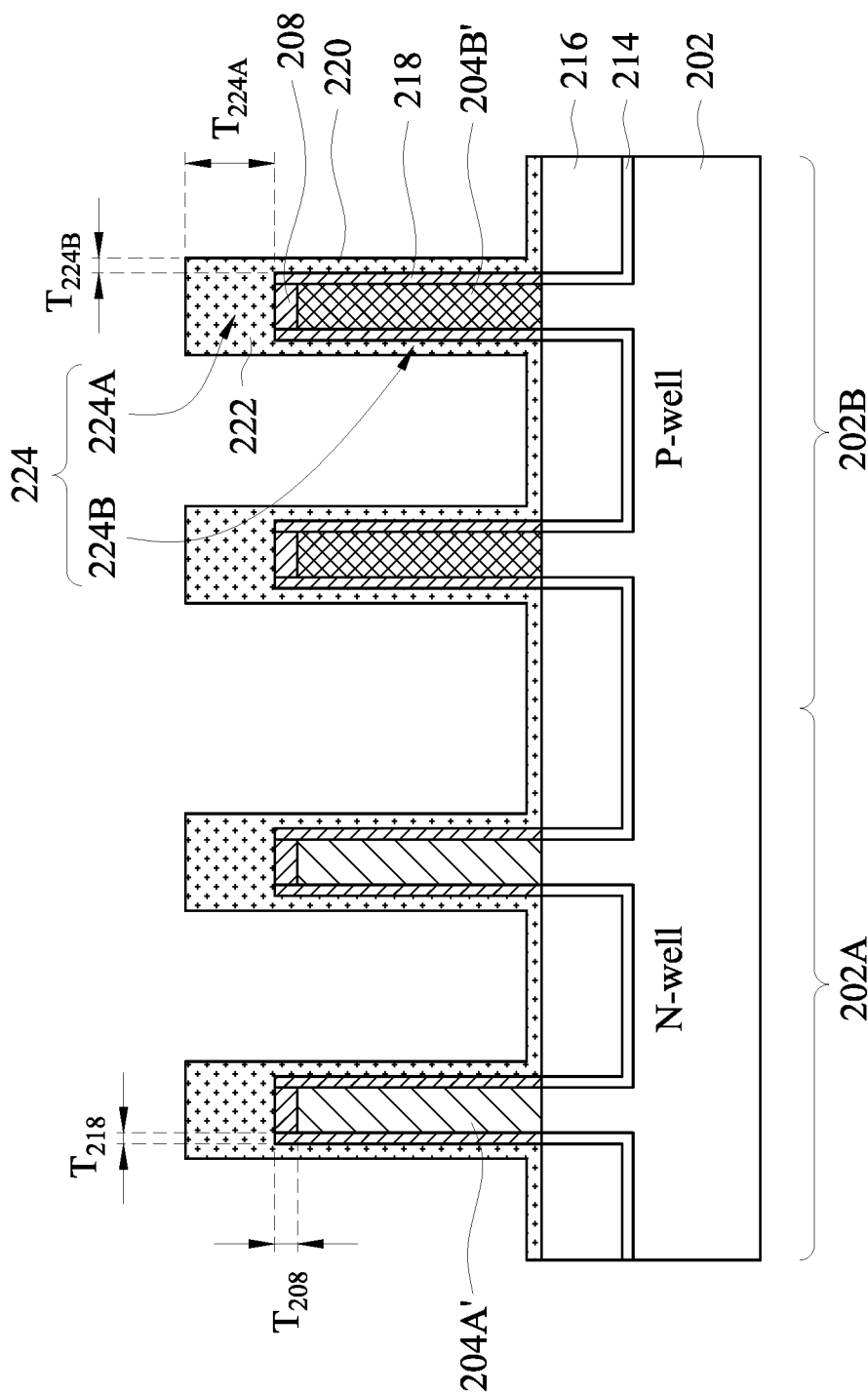

In FIG. 2F, an oxide layer 220 is formed over the epitaxial layer 208, the isolation feature 216 and the capping layer 218. The oxide layer 220 may be formed from silicon oxide, silicon oxynitride, silicon oxycarbide, or a combination thereof, and may be formed by using a CVD process, an SACVD process, a PVD process, an ALD process, or another suitable process. Then, an oxidation process is performed on the epitaxial layer 208 and the capping layer 218, such that an upper portion of epitaxial layer 208 and the capping layer 218 are oxidated by an oxygen plasma to form an oxide layer 222. Therefore, the overall oxide layer (labeled as "224" in FIG. 2F) includes the oxide layers 220 and 222 with reduced silicon variation.

In some embodiments, after the oxidation process, a thickness $T_{218}$ of the capping layer 218 is at least 3 angstroms, in order to reduce the interface trap density of the oxide layer 224. In further embodiments, a thickness $T_{208}$ of the remained epitaxial layer 208 is also at least 3 angstroms.

As shown in FIG. 2F, the oxide layer 224 includes a top portion 224A and a sidewall portion 224B. For the oxide layer 224, a thickness of a top portion 224A above the epitaxial layer 208 and the capping layer 218 is greater than a thickness of a sidewall portion 224B. With such criterion, overhang issue subsequent processes. A thickness $T_{224A}$ of the top portion 224A is greater than a thickness $T_{224B}$ of the sidewall portion 224B. In some embodiments, the thickness $T_{224A}$ of the top portion 224A is greater than the thickness $T_{224B}$ of the sidewall portion 224B by about 10 angstroms to about 50 angstroms. For example, the thickness $T_{224A}$ of the top portion 224A may be greater than the thickness $T_{224B}$ of the sidewall portion 224B by about 15 angstroms to about 25 angstroms.

Figure 2G:
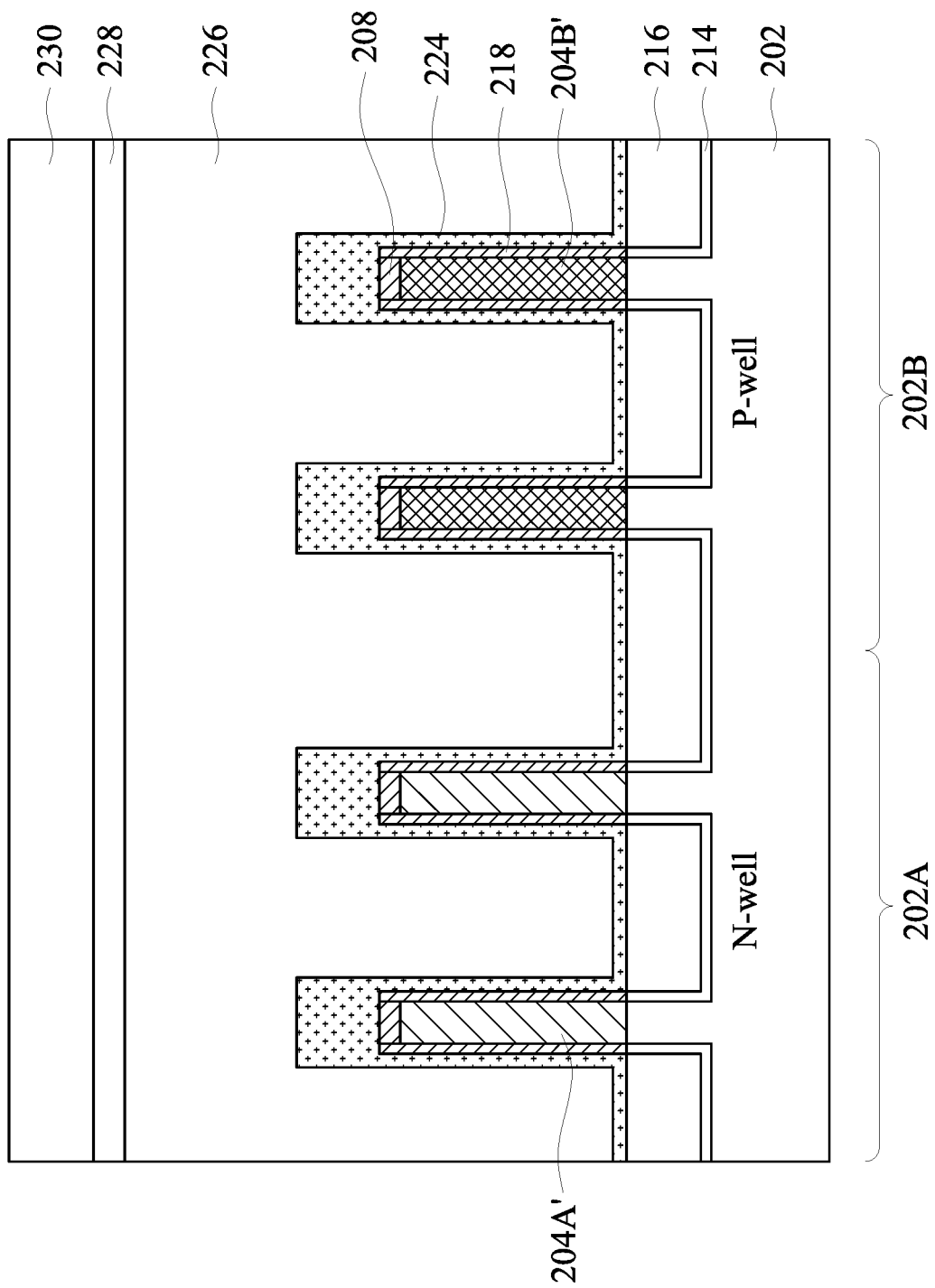

In FIG. 2G, a dummy gate structure 226 is formed over the fin structures 204A' and 204B', the epitaxial layer 208, the capping layer 218 and the oxide layer 224, a dielectric layer 228 is formed over the dummy gate structure 226, and a hard mask layer 230 is formed over the dummy gate structure 226 and the dielectric layer 228. The dummy gate structure 226 may be formed from polysilicon, amorphous silicon, combinations thereof, or another suitable material. The dummy gate structure 226 may be formed by using, for example, a CVD process, a PVD process or another suitable deposition process. The dielectric layer 228 may be formed from an oxide material, such as silicon oxide, hafnium oxide, combinations thereof, and/or the like, and may be formed by using a thermal oxidation process or another suitable process. The hard mask layer 230 may be formed from a nitride material, such as silicon nitride, silicon carbon nitride, titanium nitride, combinations thereof, and/or the like, and may be formed by using a deposition process, such as a CVD process, an LPCVD process, a PECVD process, a PVD process, an ALD process, combinations thereof, and/or another suitable process.

After the process illustrated in FIG. 2G, the hard mask layer 230, the dielectric layer 228 and the dummy gate structure 226 may be sequentially removed during the subsequent processes, and a gate structure and a gate dielectric may be formed in the locations of the substrate 202 where the dummy gate structure 226 is removed. Thus, the semiconductor device structure formed by a method in accordance with the present disclosure is similar to the semiconductor device structure 100 of FIG. 1. Particularly, the feature of non-uniform oxide layer thickness of the oxide layer 224 in accordance with the present disclosure provides several advantages. Because a portion of the oxide layer 224 above the fin structures 204A' and 204B' are formed by oxidating the upper portion of the epitaxial layer 208 and the capping layer 218, the thickness $T_{224A}$ of the top portion 224A of the oxide layer 224 is increased without producing an overhang structure at the top portion 224A of the oxide layer 224. In addition, the etching window to the dummy gate structure 226 can be increased, and damages and notching issues of the fin structures 204A' and 204B' can be avoided when performing the etching process with higher power to the dummy gate structure 226, and thus threshold voltage of the gate structure of the final semiconductor device structure is controlled to a desired value according to a design requirement.

In accordance with some embodiments, a semiconductor device structure includes a substrate, a fin structure, a capping layer and an oxide layer. The substrate has a well. The fin structure extends from the well. The capping layer surrounds a top surface and side surfaces of the fin structure. The oxide layer is over the substrate and covers the capping layer. A thickness of a top portion of the oxide layer above the capping layer is greater than a thickness of a sidewall portion of the oxide layer.

In accordance with certain embodiments, a method of forming a semiconductor device structure includes the following steps. A substrate is provided, which has a well. A semiconductor layer and an epitaxial layer are formed over the substrate. The semiconductor layer and the epitaxial layer are etched to form a fin structure that extends from the well. A capping layer is formed surrounding side surfaces of the fin structure and on the epitaxial layer. A first oxide layer is formed over the capping layer and the substrate. A portion of the capping layer and a portion of the epitaxial layer are oxidized to form a second oxide layer between the remained epitaxial layer and the first oxide layer.

In accordance with some embodiments, a semiconductor device structure includes a substrate, a first fin structure, a second fin structure, a capping layer and an oxide layer. The substrate has a first well of a first type and a second well of a second type different from the first type. The first fin structure extends from the first well, and the second fin structure extends from the second well. The capping layer surrounds a top surface and side surfaces of each of the first fin structure and the second fin structure. The oxide layer is over the substrate and covers the capping layer. A thickness of a top portion of the oxide layer above the capping layer is greater than a thickness of each of sidewall portions of the oxide layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   forming a SiGe layer over a first device region of a substrate;
   forming a semiconductive layer over a second device region of the substrate;
   forming a silicon layer over the substrate, wherein the silicon layer covers and is in direct contact with the SiGe layer and the semiconductive layer;
   patterning the silicon layer and the SiGe layer to form a first fin structure over the substrate, wherein the first fin structure comprises a remaining portion of the SiGe layer and a first remaining portion of the silicon layer over the remaining portion of the SiGe layer;
   forming a semiconductive capping layer to cover the first fin structure; and
   oxidizing a top portion of the semiconductive capping layer and the first remaining portion of the silicon layer to form an oxide layer covering the first fin structure.

2. The method of claim 1, wherein a portion of the remaining portion of the silicon layer is between the oxide layer and the remaining portion of the SiGe layer.

3. The method of claim 1, wherein the oxide layer comprises:
   a top portion over the first fin structure; and
   a sidewall portion on a sidewall of the semiconductive capping layer, wherein the top portion is thicker than the sidewall portion of the oxide layer.

4. The method of claim 1, further comprising:
   forming a dummy gate structure over and in contact with the oxide layer.

5. The method of claim 4, further comprising:
   replacing the dummy gate structure with a gate dielectric layer and a gate structure, wherein the gate dielectric layer is in contact with the oxide layer and the gate structure.

6. The method of claim 1, further comprising:
   forming a dielectric spacer laterally sandwiching between the SiGe layer and the semiconductive layer, wherein after the step of forming the silicon layer, the silicon layer covers and is in direct contact with the dielectric spacer.

7. The method of claim 1, further comprising:
   patterning the silicon layer and the semiconductive layer to form a second fin structure over the substrate, wherein the second fin structure comprises a remaining portion of the semiconductive layer and a second remaining portion of the silicon layer over the remaining portion of the semiconductive layer.

8. A method comprising:
   forming a first semiconductive layer and a second semiconductive layer over a first device region and a second device region of a substrate, respectively;
   epitaxially growing a third semiconductive layer over and being in direct contact with the first and second semiconductive layers;
   patterning the third semiconductive layer and the first semiconductive layer to form a first fin structure through a first hard mask layer formed over the third semiconductive layer, wherein the first fin structure comprises a first semiconductive portion of the first semiconductive layer and a second semiconductive portion of the third semiconductive layer over the first semiconductive portion, and the first hard mask layer is over the second semiconductive portion;
   forming a liner layer lining a sidewall of the first semiconductive portion, wherein the liner layer exposes a sidewall of the second semiconductive portion;
   forming an isolation material over the liner layer and in contact with the sidewall of the second semiconductive portion;
   removing the first hard mask layer; and
   recessing the isolation material and the liner layer until the sidewall of the second semiconductive portion and the sidewall of the first semiconductive portion are exposed.

9. The method of claim 8, wherein forming the isolation material is further such that the isolation material is in contact with the sidewall of the first semiconductive portion.

10. The method of claim 8, wherein forming the isolation material is further such that the isolation material is further in contact with a top surface of the liner layer.

11. The method of claim 8, further comprising:
    forming a silicon layer to cover the sidewall of the second semiconductive portion and the sidewall of the first semiconductive portion.

12. The method of claim 11, further comprising:
    forming an oxide layer to cover the silicon layer and the isolation material.

13. The method of claim 8, further comprising:
    forming a dielectric spacer upwardly extending from the substrate and interposing the first and second semiconductive layers, wherein after the step of epitaxially growing the third semiconductive layer, the third semiconductive layer covers and is in direct contact with the dielectric spacer.

14. The method of claim 8, further comprising:
    patterning the third semiconductive layer and the second semiconductive layer to form a second fin structure through a second hard mask layer formed over the third semiconductive layer, wherein the second fin structure comprises a third semiconductive portion of the second semiconductive layer and a fourth semiconductive portion of the third semiconductive layer over the third semiconductive portion.

15. A method comprising:
   forming a first semiconductive layer over a first device region of a substrate;
   forming a dielectric spacer on a sidewall of the first semiconductive layer;
   forming a second semiconductive layer over a second device region of the substrate, wherein the dielectric spacer is between the first semiconductive layer and the second semiconductive layer;
   epitaxially growing a third semiconductive layer over the substrate, wherein the third semiconductive layer covers and is in direct contact with the first semiconductive layer, the second semiconductive layer, and the dielectric spacer; and
   patterning the third semiconductive layer, the first semiconductive layer, and the second semiconductive layer to form a first fin structure over the first device region and comprising a remaining portion of the first semiconductive layer and a first portion of the third semiconductive layer over the remaining portion of the first semiconductive layer and form a second fin structure over the second device region and comprising a remaining portion of the second semiconductive layer and a second portion of the third semiconductive layer over the remaining portion of the first semiconductive layer.

16. The method of claim 15, wherein the third semiconductive layer is a silicon layer.

17. The method of claim 15, wherein the dielectric spacer comprises silicon nitride, silicon oxynitride, or silicon carbide.

18. The method of claim 15, further comprising:
   doping first dopants in the first semiconductive layer prior to epitaxially growing the third semiconductive layer.

19. The method of claim 18, further comprising:
   doping second dopants in the second semiconductive layer prior to epitaxially growing the third semiconductive layer, wherein the second dopants are different from the first dopants.

20. The method of claim 15, further comprising:
   forming a silicon layer to cover the first fin structure; and
   forming an oxide layer to cover the silicon layer.

* * * * *